(12) United States Patent
Ajika et al.

(10) Patent No.: US 7,515,479 B2
(45) Date of Patent: Apr. 7, 2009

(54) NONVOLATILE SEMICONDUCTOR STORAGE DEVICE AND METHOD FOR WRITING THEREIN

(75) Inventors: Natsuo Ajika, Hyogo (JP); Shoji Shukuri, Hyogo (JP); Masaaki Mihara, Hyogo (JP); Moriyoshi Nakashima, Hyogo (JP)

(73) Assignee: Genusion, Inc., Amagasaki-shi, Hyogo (JP)

( * ) Notice: Subject to any disclaimer, the term of this patent is extended or adjusted under 35 U.S.C. 154(b) by 394 days.

(21) Appl. No.: 10/598,853

(22) PCT Filed: Nov. 1, 2005

(86) PCT No.: PCT/JP2005/020063

§ 371 (c)(1),
(2), (4) Date: Oct. 12, 2006

(87) PCT Pub. No.: WO2006/049143

PCT Pub. Date: May 11, 2006

(65) Prior Publication Data

US 2008/0273387 A1    Nov. 6, 2008

(30) Foreign Application Priority Data

Nov. 1, 2004  (JP) .............................. 2004-318333
Jan. 21, 2005  (JP) .............................. 2005-014780

(51) Int. Cl.
    *G11C 11/34*    (2006.01)

(52) U.S. Cl. .............................. 365/185.28; 365/185.27; 365/185.26

(58) Field of Classification Search ............ 365/185.28, 365/185.27, 185.26
    See application file for complete search history.

(56) References Cited

U.S. PATENT DOCUMENTS

| 5,687,118 | A |   | 11/1997 | Chang |
| 5,877,524 | A |   | 3/1999 | Oonakado et al. |
| 6,172,908 | B1 | * | 1/2001 | Cappelletti et al. ..... 365/185.19 |

FOREIGN PATENT DOCUMENTS

| JP | 09-008153 | 1/1997 |
| JP | 09-246404 | 9/1997 |
| JP | H9-260518 | 10/1997 |

* cited by examiner

*Primary Examiner*—Son Dinh
*Assistant Examiner*—Nam Nguyen
(74) *Attorney, Agent, or Firm*—The Marbury Law Group, PLLC

(57) ABSTRACT

A hot electron (BBHE) is generated close to a drain by tunneling between bands, and bit data writing is performed by injecting the hot electron into a charge storage layer. When Vg is a gate voltage, Vsub is a cell well voltage, Vs is a source voltage and Vd is a drain voltage, a relation of Vg>Vsub>Vs>Vd is satisfied, Vg−Vd is a value of a potential difference required for generating a tunnel current between the bands or higher, and Vsub−Vd is substantially equivalent to a barrier potential of the tunnel insulating film or higher.

12 Claims, 16 Drawing Sheets

|  |  | Program | Prg-verify | Erase(tn) | Erase(hh) | Read |
|---|---|---|---|---|---|---|
| selected | Main-BL | GND | VCC | VCC | VCC | GND |
| | SG | -2.2V | -2.2V | VCC | VCC | -2.2V |
| | Sub-BL | GND | VCC | open | open | GND |
| | WL | 10V | -5V | -13V | -13V | -2.2V |
| | Source | VCC | GND | VCC | -4V | VCC |
| | Cell-well | 4V | 4V | VCC | -1V | VCC |
| | SG-well | VCC | VCC | VCC | VCC | VCC |
| Un-selected | Main-BL | VCC | VCC | VCC | VCC | VCC |
| | SG | VCC | VCC | VCC | VCC | VCC |
| | Sub-BL | open | open | open | open | open |
| | WL | VCC | VCC | VCC | VCC | VCC |
| | Source | VCC | VCC | VCC | VCC | VCC |
| | Cell-well | VCC | VCC | VCC | VCC | VCC |
| | SG-well | VCC | VCC | VCC | VCC | VCC |
| | sub | GND | GND | GND | GND | GND |

FIG.3

(A)
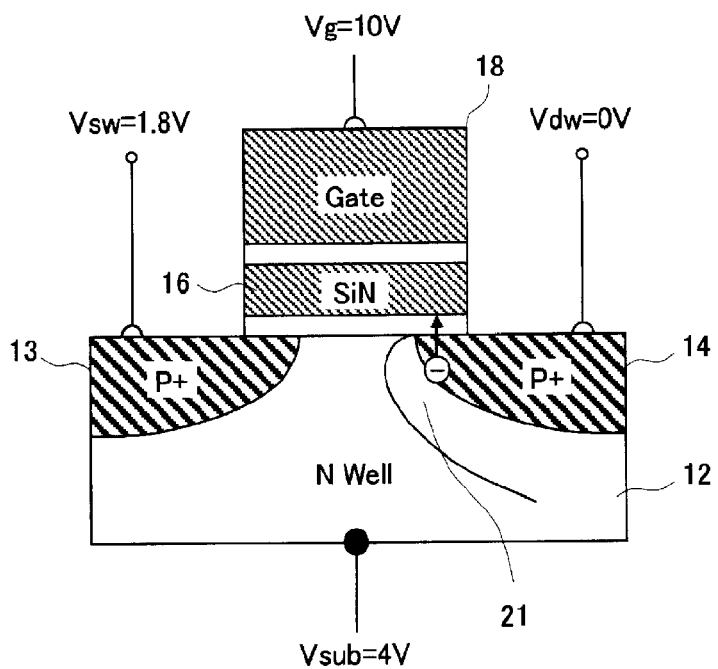
(B)
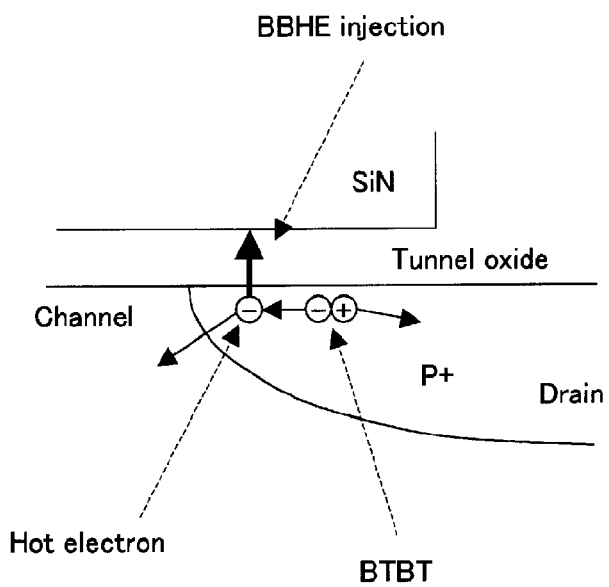
FIG.6

NONVOLATILE SEMICONDUCTOR STORAGE DEVICE AND METHOD FOR WRITING THEREIN

TECHNICAL FIELD

The present invention relates to a nonvolatile semiconductor storage device which realizes scaling of gate lengths of nonvolatile semiconductor memory cells, and method for writing therein.

BACKGROUND OF THE INVENTION

Recently, concern over the limit of scaling of a NOR type flash memory for code storage having a capability of random access, is increasing.

According to the technology prediction by ITRS (International Technology Roadmap for Semiconductors) in 2004, even in 2018 when 20 nm semiconductor process technology is predicted to be utilized, it is said to be difficult to realize gate lengths of 130 nm for memory cells of a NOR type flash memory.

One of the main reasons why gate lengths of a NOR type flash memory can not scale is that Channel Hot Electron (CHE) injection is used for writing operations. In order to generate Channel Hot Electron efficiently, a relatively large potential difference is required, which is not less than a barrier voltage of tunnel insulating layer (silicon oxide layer), across a source and a drain of a memory cell. Due to a relatively large depletion layer formed from the drain toward the source of the memory cell caused by the potential difference, scaling of gate lengths will cause problems such that the drain and the source will be connected by the depletion layer (punch through) and generation of Hot Electrons will be prevented.

In order to deal with the problem noted above, a reduction in the potential difference Vds across a source and a drain by using materials for tunnel insulating layers which have lower barrier voltages than tht of silicon oxide layer is proposed (see Patent Document No. 1). Furthermore, a NOR type flash memory which applies a method for writing operation other than Channel Hot Electron Injection is also proposed (see Patent Document No. 2).

Patent Document No. 1: Japanese Patent Publication 2001-237330,

Patent Document No. 2: Japanese Patent Publication H09-8153.

DISCLOSURE OF THE INVENTION

Problem to be Solved by the Invention

Due to the fact that the carrier leakage characteristic of said material is worse than that of silicon oxide layer, the technology described in the Patent Document No. 1 is so far not practiced for tunnel insulating layers of nonvolatile semiconductor memories.

Furthermore, the technology described in the Patent Document No. 2 is related to a writing by band to band induced Hot Electron injection (BBHE), instead of Channel Hot Electron Injection, which requires the source/drain potential difference Vds to be relatively large (e.g. 4V) in order to prevent the energy of hot electrons from being less than the potential barrier of the tunnel insulating layer which restricts the scaling of the gate length.

An object of the present invention is to provide a nonvolatile semiconductor memory device which can scale gate lengths of memory cells by reducing potential difference Vds across a source and a drain and method for writing therein.

Method to Solve the Problem (1) A method for writing bit data to a nonvolatile semiconductor memory device, said nonvolatile semiconductor memory device comprising, an n type well formed in a semiconductor substrate, a source and a drain of p+ regions formed in the surface of said n type well with a predetermined interval, a channel region formed between said source and said drain, a charge accumulation layer of a floating gate, a nanocrystal layer, a nonconductive charge trap layer such as a silicon nitride layer, and so on, formed above said channel region via a tunnel insulating layer, and a gate electrode formed above said charge accumulation layer via an insulating layer, said method comprising:

applying Vg, Vsub, Vs and Vd to the gate electrode, the n type well, the source and the drain respectively during writing, the Vg, the Vsub, the Vs and the Vd being in a relationship of "Vg>Vsub>Vs>Vd" and "Vg−Vd" being not less than an electrical potential difference necessary to generate band to band tunneling current at said channel region, thereby generating hot electrons near the drain by band to band tunneling, and injecting said hot electrons into said charge accumulation layer to write the bit data.

(2) A method for writing bit data to a nonvolatile semiconductor memory device, said nonvolatile semiconductor memory device comprising, a p type well formed in a semiconductor substrate, a source and a drain of n+ regions formed in the surface of said p type well with a predetermined interval, a channel region formed between said source and said drain, a charge accumulation layer of a floating gate, a nanocrystal layer, a nonconductive charge trap layer such as a silicon nitride layer, and so on, formed above said channel region via tunnel insulating layer, and a gate electrode formed above said charge accumulation layer via an insulating layer, said method comprising, applying Vg, Vsub, Vs, and Vd to the gate electrode, the p type well, the source and the drain respectively during writing, the Vg, the Vsub, the Vs, and the Vd being in a relationship of "Vg<Vsub<Vs<Vd" and "Vd−Vg" being not less than an electrical potential difference necessary to generate band to band tunneling current at said channel region, thereby generating hot holes near the drain by band to band tunneling, and injecting said hot holes into said charge accumulation layer to write the bit data.

(3) Two voltages from said Vg, Vsub, Vs and Vd are supplied from an external power supply.

(4) At least Vd among said Vg, Vsub, Vs and Vd is supplied from an external power supply.

(5) Vs and Vd among said Vg, Vsub, Vs and Vd are supplied from an external power supply.

(6) Said Vs is a power supply voltage and Vd is a ground voltage.

(7) The memory cells written by method (1) or (2), and arrayed by connecting in a NOR type or in a NAND type.

Effects of the Invention

According to the present invention, setting the voltages in a relationship of "Vg>Vsub>Vs>Vd (p-channel)" or "Vg<Vsub<Vs<Vd (n-channel)", i.e., setting the source voltage Vs between the cell well voltage Vsub and the drain voltage Vd, causes hot electrons or hot holes to be generated efficiently by band to band tunneling, minimizes the potential difference between the source and the drain, and therefore scales the gate length. For fast writing, the potential difference of the cell well voltage Vsub and the drain voltage Vd is preferred to be equivalent or not less than the barrier voltage of the tunneling insulating layer.

Furthermore, according to the present invention, the number of voltage stepping-up circuits to generate the voltages in a chip can be reduced by supplying any one of the voltages Vg, Vsub, Vs and Vd from the external power supply. Therefore, a chip area can be scaled and the cost of a nonvolatile semiconductor memory device can be reduced.

Particularly, supplying the drain voltage Vd, which consumes the largest amount of current during writing, from an external power supply, may reduce the capability to supply the current of the voltage stepping-up circuits in the chip, and a chip area can be further scaled.

Furthermore, according to the present invention, by applying an appropriate back gate voltage to the cell well, the source voltage Vs can be the power supply voltage and the drain voltage Vd can be the ground voltage, and allows two of the four voltages to be supplied from the external supply and allows the remaining two voltages (the gate voltage Vg, the cell well voltage Vsub) to be voltages with the same polarity to the power supply voltage.

BRIEF DESCRIPTION OF DRAWINGS

FIG. 3 shows a potential distribution for the NOR-connected array during programming, verifying, erasing and reading out.

FIG. 6 shows a potential distribution of a single memory cell and a principle of BTHE injection during programming.

DESCRIPTION OF CODES

Figure 1:
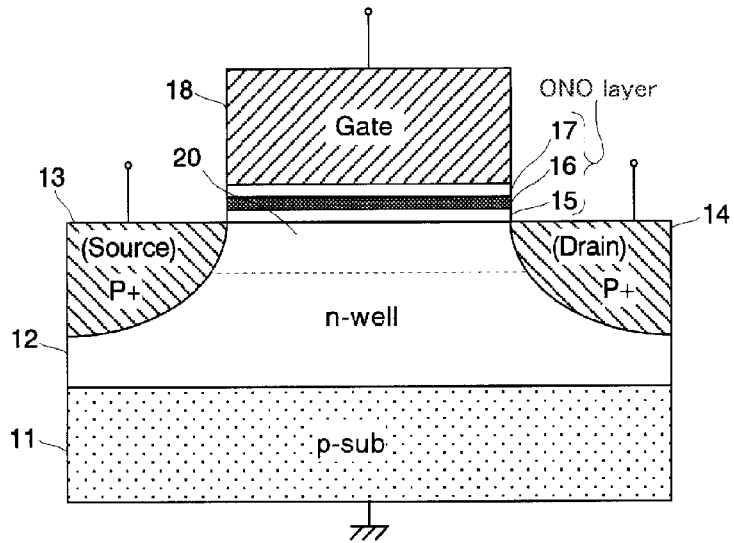
FIG. 1 shows a schematic configuration of a p-channel MONOS memory cell implementing the present invention.

11 . . . p-type semiconductor substrate
12 . . . n-type well (cell well)
13 . . . source (p+ region)
14 . . . drain (p+ region)
15 . . . tunneling insulating layer
16 . . . channel trap layer (nitride layer)
17 . . . upper insulating layer
18 . . . gate
20 . . . selection gate well (n-type well)
21 . . . main bit line
22 . . . word line
23 . . . source line
24 . . . selection gate
25 . . . sub bit line

PREFERRED EMBODIMENTS TO IMPLEMENT THE PRESENT INVENTION

The embodiments of the invention will be explained with reference to the accompanying drawings. FIG. 1 shows a schematic configuration of the p-channel MONOS memory cell implementing the present invention. The memory cell has an n type well (cell well) 12 formed in a semiconductor substrate 11, a p+ region (source) 13 and a p+ region (drain) 14 formed near the surface of the n type well with a predetermined interval, a channel region 20 formed between the two p type regions 13 and 14, and an ONO layer and a gate electrode 18 formed above the channel region 20 and to cover the channel region 20.

The ONO layer consists of a tunnel insulating layer 15 made by silicon oxide, a charge trap layer 16 to accumulate injected charges made by silicon nitride and an insulating layer 17 made by silicon oxide. The thicknesses of these three layers: the thickness of the tunnel insulating layer 15 is approximately 2.5~5 nm, the thickness of the charge trap layer 16 is approximately 10 nm, and the thickness of the insulating layer 17 is approximately 5 nm. The gate electrode 18 is made by poly silicon. The gate length can be considerably shortened to realize a length not more than nm by distributing writing potentials which will be explained hereinafter.

Figure 2:
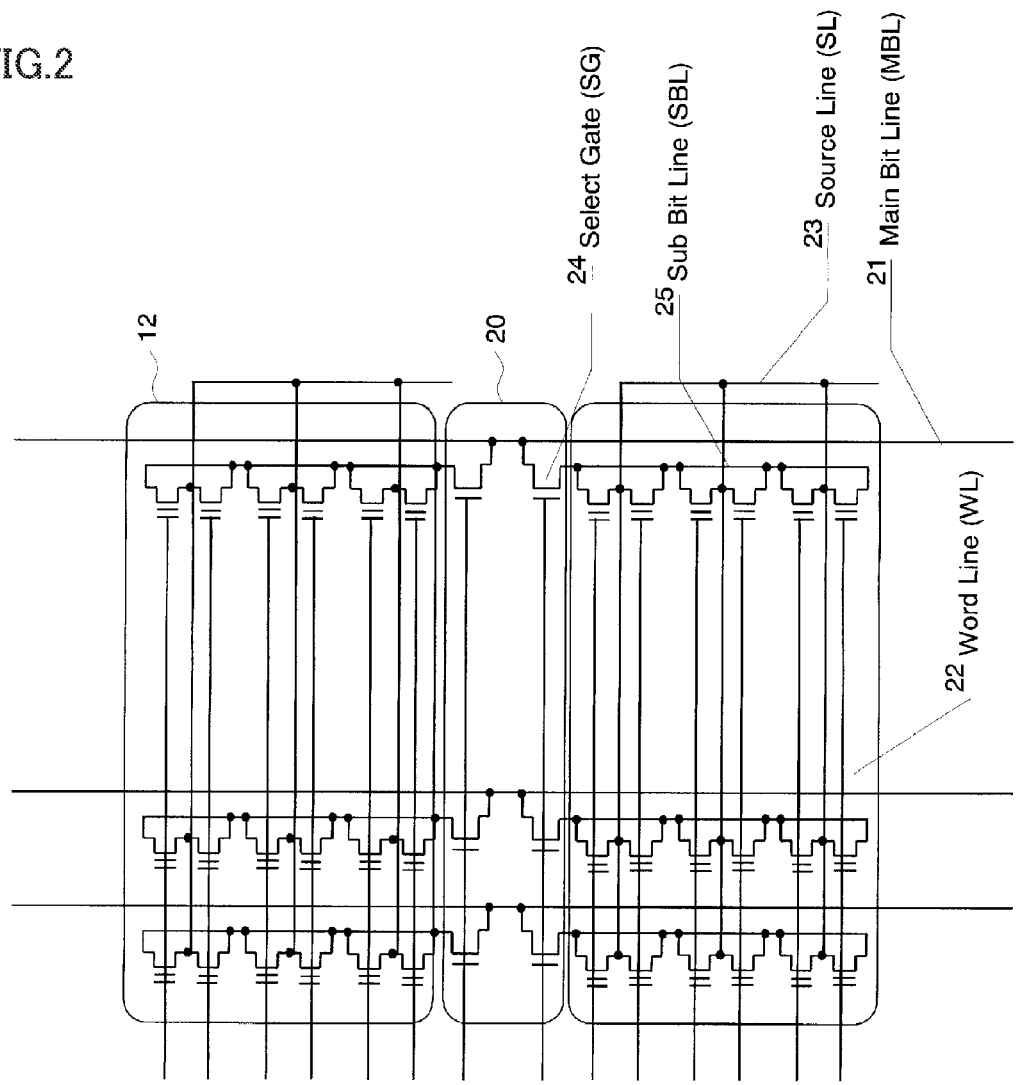
FIG. 2 is an equivalent circuit showing the architecture in the case of the p-channel MONOS memory cells arranged in XY to form a NOR-connected array.

Next, the architecture of the nonvolatile semiconductor memory device wherein said memory cells are connected to be a NOR-connected array is explained by referring to FIG. 2. Two of the cell wells 12 are paired in this nonvolatile semiconductor memory device. Memory cells of 1 kB at=8 k (8192) at x direction by 64 at y direction=512 k (524288) are formed in the cell well. The number of main bit lines is 8 k, each of the main bit lines are connected to one of the sub bit lines 25 of the two cell wells 12 via a select gate 24. The 8 k main bit lines 21 are connected to latches respectively. The latch is used during program verifying and the like. The select gate 24 is formed in a select gate well (n type well) 20 which is different from the cell well 12 and the select gate is comprised of a p channel MOS transistor. The potential of the select gate well 20 is usually set at VCC (e.g. 1.8V). VCC is applied to the gate electrode of the select gate 24 when non-selected and −2.2v is applied when selected. By applying −2.2v and rendering the gate conductive, the main bit line 21 is connected to the sub bit line 25 which is connected to the drain of the respective memory cells. Word lines connect the gate electrodes of the respective memory cells in x direction. The 64 word lines are provided to cell wells 12 respectively. A source line is common for the 512 k memory cells in the respective memory cells.

The voltage VCC and GND (ground voltage) are supplied from a source supply circuit which is external to the memory cell.

The writing operation (program verify), reading out operation and erasing operation of the NOR-connected nonvolatile semiconductor memory device as shown in FIG. 2 are explained referring to FIG. 3 to FIG. 14. FIG. 3 to FIG. 14 show potential distributions and operational principles during writing (program verify), reading out and erasing operations.

In this nonvolatile semiconductor memory device, by reducing the source voltage lower than the cell well voltage Vsub to be close to the drain voltage Vd, by reducing the potential difference between the drain and the source and by applying an appropriate back gate voltage to the cell well (back gate effect) during writing by BBHE injections, the equivalent threshold voltage Vth (absolute value) is raised and the punch through is suppressed. Therefore, a cell structure which has the reduced gate length not more than 0.1 µm, for example 60 nm approximately, is realized Furthermore, by applying the appropriate back gate voltage to the cell well, the bit line, requiring the fastest operation, can operate between GND and VCC. Therefore, the control circuit for the bit line can be made by fast and positive VCC circuits, enabling fast operation and a simplified structure.

Firstly, the program operation of the writing operation is explained. Trapped electrons do not move in the layer due to the nitride layer which has low electro-conductivity used as the charge trap layer 16 and remain in the place where the electrons are trapped in the MONOS memory cell as previously stated. Writing (programming) in the memory cell is performed by injecting electrons into the charge trap layer 16. The injection of electrons is performed by BBHE injection by applying positive and negative high voltages to the gate electrode 18 and the drain 14 and the electrons are injected in the charge trap layer 16.

Injection of charges to the charge trap layer 16 is performed by the injection of hot electrons caused by band to band tunneling using a strong electrical field in a depletion layer generating a large potential difference between the electrode 18 at a positive potential and the drain 14 at a negative potential (BBHE: Band-to-Band tunneling induced Hot Electron). In order to control the drain (=bit line) within the positive potential, a positive back gate voltage is applied to the cell well 12. Therefore, the ground potential of the drain will be relatively negative.

Figure 4:
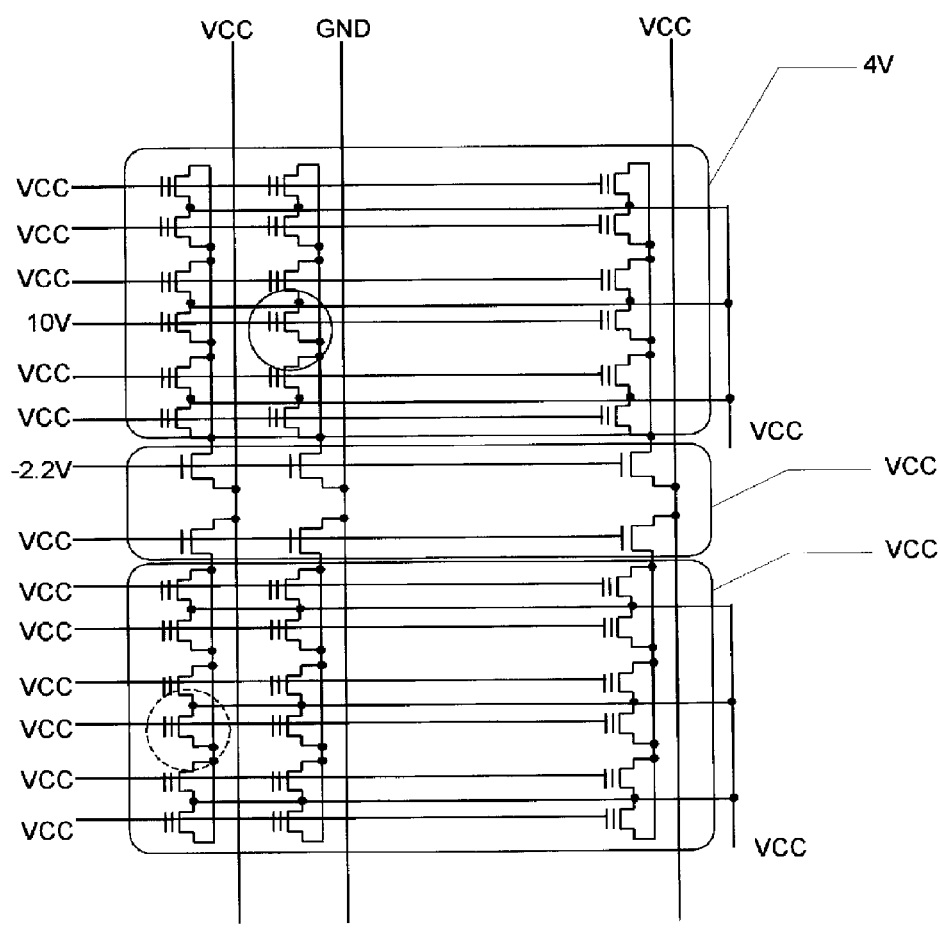
FIG. 4 shows a potential distribution in the equivalent circuit during programming.
Figure 5:
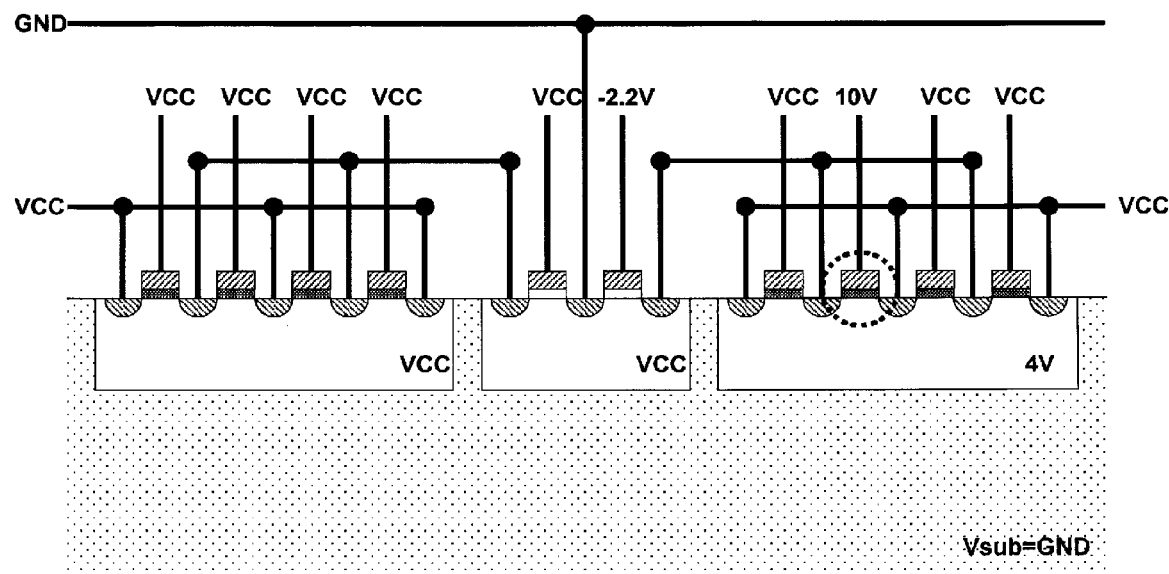
FIG. 5 shows a potential distribution in a cross sectional view during programming.

Specifically, as shown in FIG. 3, FIG. 4 and FIG. 5, +4V as the back gate voltage Vsub is applied to the cell well 12 and the drain 14 (bit line) is turned to ground potential (Vdw=0). 10V as the gate voltage Vgw is applied to the gate 18 (word line). At this time, VCC (=1.8V) is applied to the source 13 (source line).

FIG. 6 shows a potential distribution of a single memory cell during writing. By setting the potential distribution as above, the depletion layer 21 generates at the junction surface of the drain 14 and the cell well 12 and electron/hole pairs are generated by the band to band tunneling (BTBT) at the drain 14. The electrons are accelerated by the strong electrical field and become hot electrons with high energy. Parts of the hot electrons are pulled by the positive potential applied to gate electrode 18 and are injected to the charge trap layer 16 by traversing the tunnel insulating layer 15.

This injection of charges is performed when the area between the source 13 and the drain 14 is turned off, therefore an injection efficiency of approximately $10^{-2}$ is secured and a high injection efficiency of approximately $\times 10^3$ compared with a conventional method of channel hot electrons may be obtained In this case, the source 13 is applied with VCC (e.g. 1.8V) and the potential difference between the source and the drain is approximately 1.8V. Even if the gate length is shortened, the depletion layer near the drain 14 does not extend to source 13 to become conductive (punch through). Furthermore, the cell well 12 is applied with the back gate voltage of 4V, which renders a back gate effect in which electrons discharged into the channel are pulled to the substrate to relatively increase the threshold voltage Vth (absolute value), suppressing the conduction during writing.

By applying the appropriate positive back gate voltage to the cell well 12 during programming as described above, the drain (bit line) can be controlled within 0V to VCC (positive potential). Therefore, the Y-peripheral circuits (for bit line) which requires fast operation during writing, can be made by a positive voltage circuit using high performance VCC transistors, thereby fast writing and simplification of circuit configurations are achieved.

The writings (the injection of the electrons) of the bits are repeated step by step with verifying until the threshold voltages Vth become predetermined voltages. Therefore, the threshold voltages of written bits are substantially the same and the cells are not depleted by too much electron injection.

Figure 7:
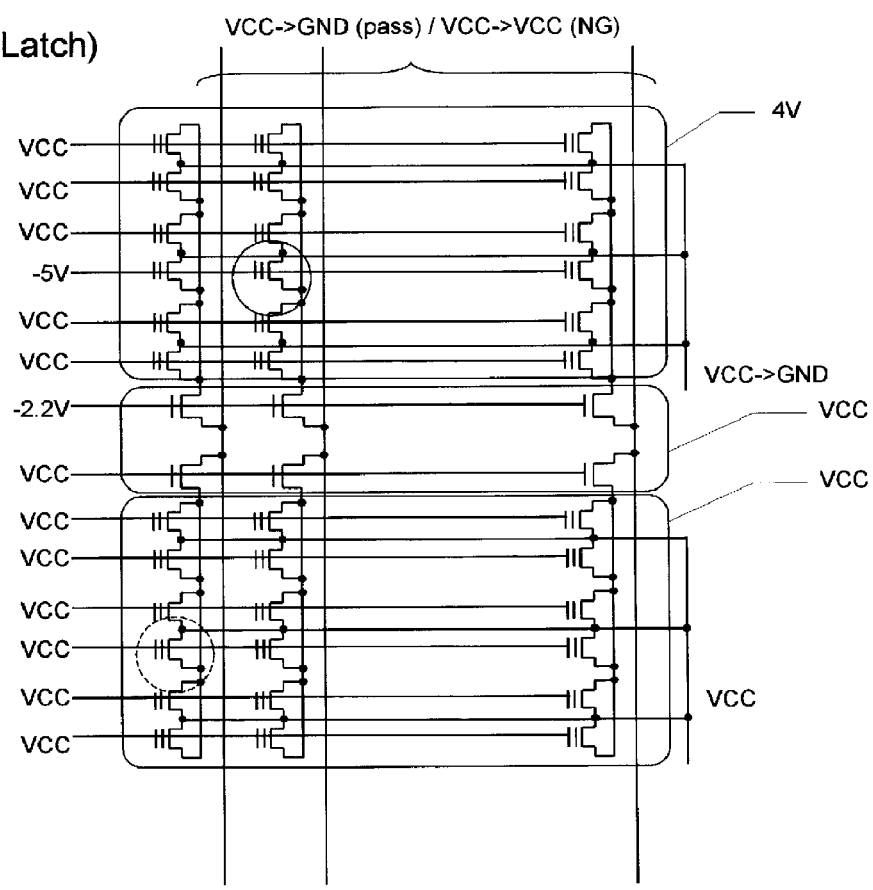
FIG. 7 shows a potential distribution in the equivalent circuit during verifying.
Figure 8:
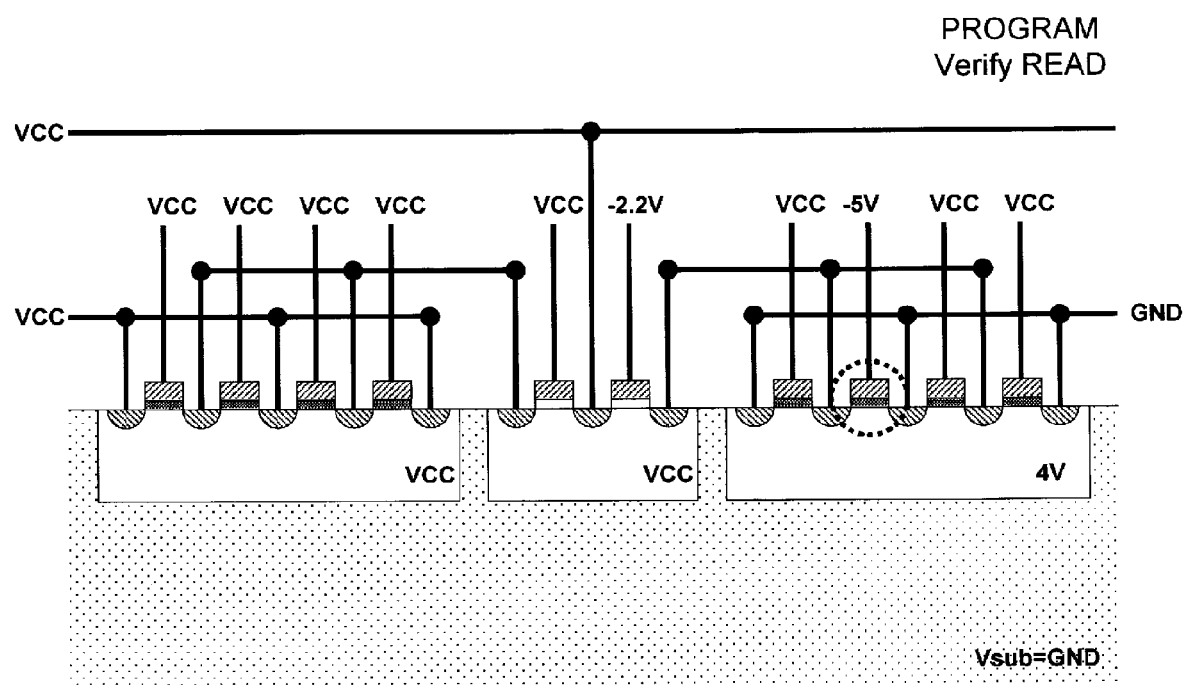
FIG. 8 shows a potential distribution in a cross sectional view during verifying.

Next, a verifying operation of the writing operation is explained by referring to FIG. 3, FIG. 7 and FIG. 8. The verifying is a repeated operation performed along with programming in order to confirm whether the threshold voltage Vth is at a predetermined voltage.

In order to realize fast writing, the operation switches from said programming to the verifying should be performed quickly. Due to the back gate voltage applied to the cell well 12 in the operation of said programming, it is difficult to quickly change the cell well voltage which has large parasitic capacitance toward VCC-4V during the programming/verifying switches. Therefore, the verifying is performed with the back gate voltage (4V) being applied to the cell well 12 in this embodiment. In the verifying operation, the word line 21 (the gate electrode 18) is set at a high voltage greater than the normal reading out voltage (−2.2V; which will be explained hereinafter) for example −5V, because the voltage of the cell well 12 remains at 4V. In this case, the source line 23 is driven to GND after the source line 23 and the bit lines 21 and 25 are charged to VCC. When the programming is finished, the bit lines 21 and 25 are discharged and become at GND because the channel becomes conductive. If the programming is not finished, the bit lines 21 and 25 remain at VCC. This potential of the bit line is latched and the bit line voltage for the next programming pulse application is determined based on this potential. Only for the bit line with VCC latched voltage electron injection will be performed again in the next programming pulse.

Thus, by performing verifying operation with the back gate voltage 4V being applied to the cell well 12, the programming/verifying switch is quickly done and fast writing of bits is realized.

On the other hand, a reading out operation is required to be faster than writing operation and the quick switching of not only the bit line but also the word line is necessary. The back gate voltage applied to the cell well 12 is set at normal voltage (VCC=1.8V) and the reading out voltage applied to the word line is set at −2.2V.

Figure 9:
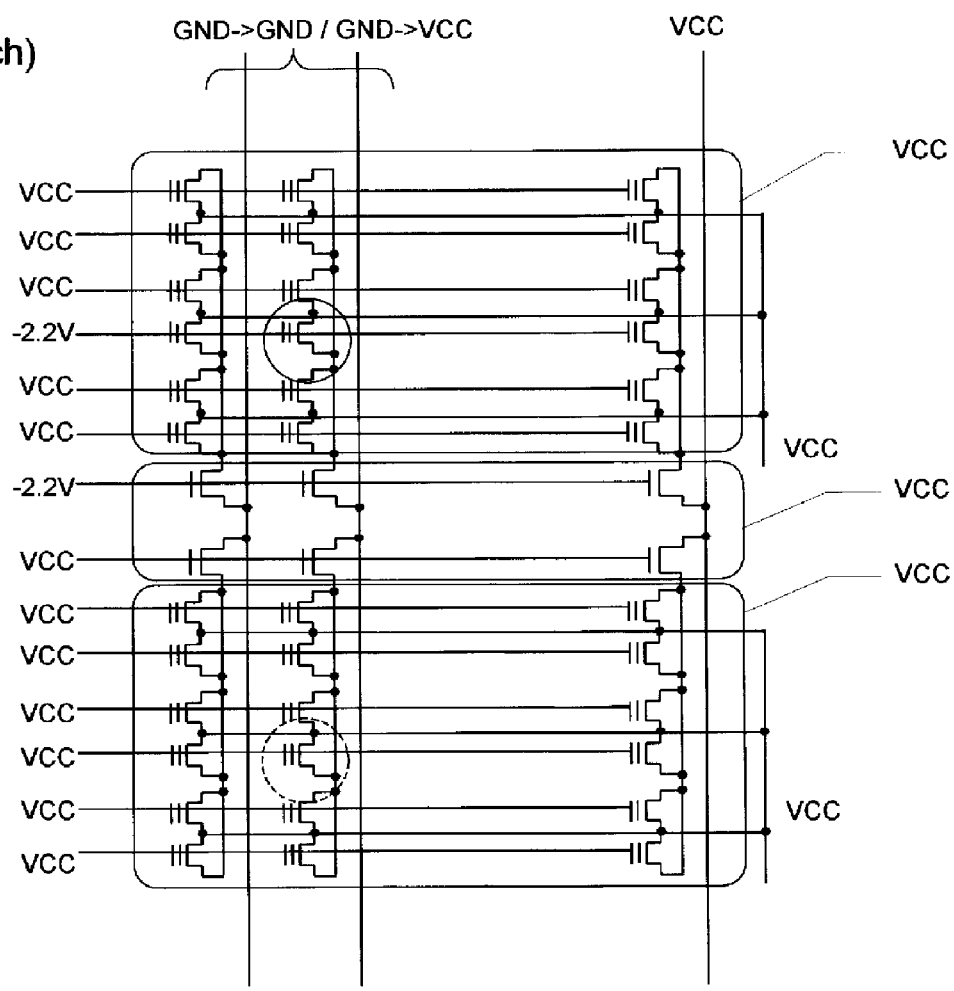
FIG. 9 shows a potential distribution in the equivalent circuit during reading out.
Figure 10:
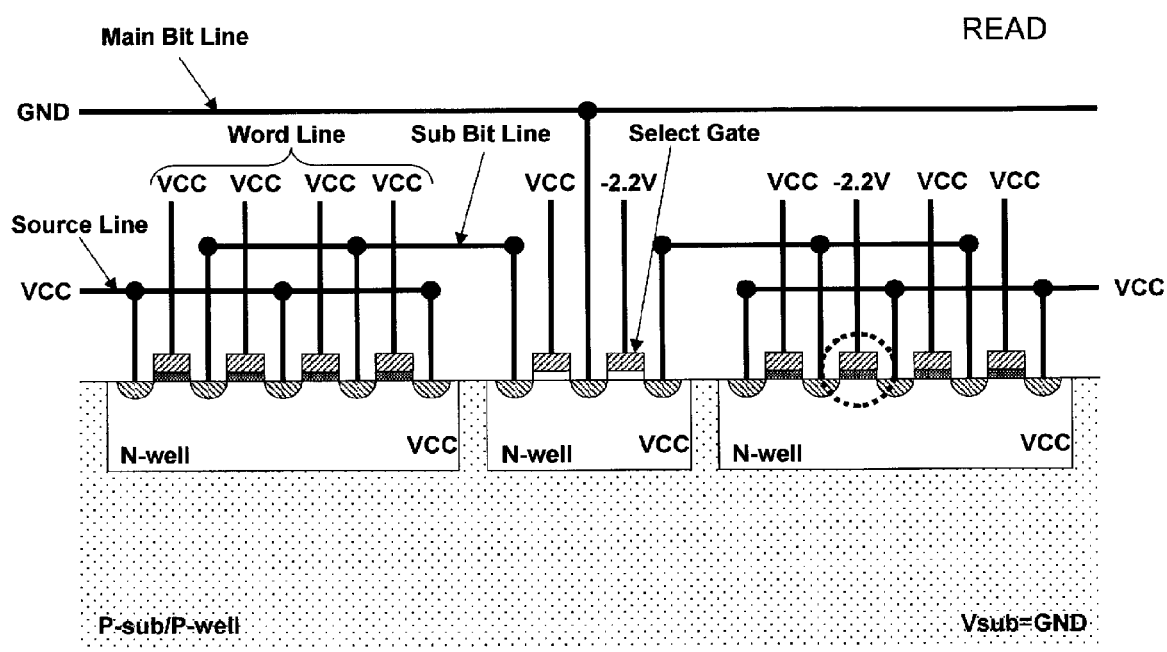
FIG. 10 shows a potential distribution in a cross sectional view during reading out.

Next, the reading out operation is explained by referring to FIG. 3, FIG. 9 and FIG. 10. In the reading out operation, VCC is applied to the cell well 12 as the back gate voltage and the source line 23 (source 13) is applied with VCC (=1.8V). The voltage of the word line 22 (gate 18), which is to be read out, is changed to read out voltage Vgr=−2.2V from VCC after setting the bit line 22 and 25 (drain 14) to be read out at GND. Thus, when the cell is at the programmed state by this potential distribution, the bit lines 21 and 25 are raised to VCC and when the cell is at the un-programmed state, the bit lines 21 and 25 remain at GND.

Next, the erasing operation is explained. The methods for erasing may be a method for discharging by FN (Fowler-Nordheim) tunnel or a method for injecting by substrate hot hole.

Figure 11:
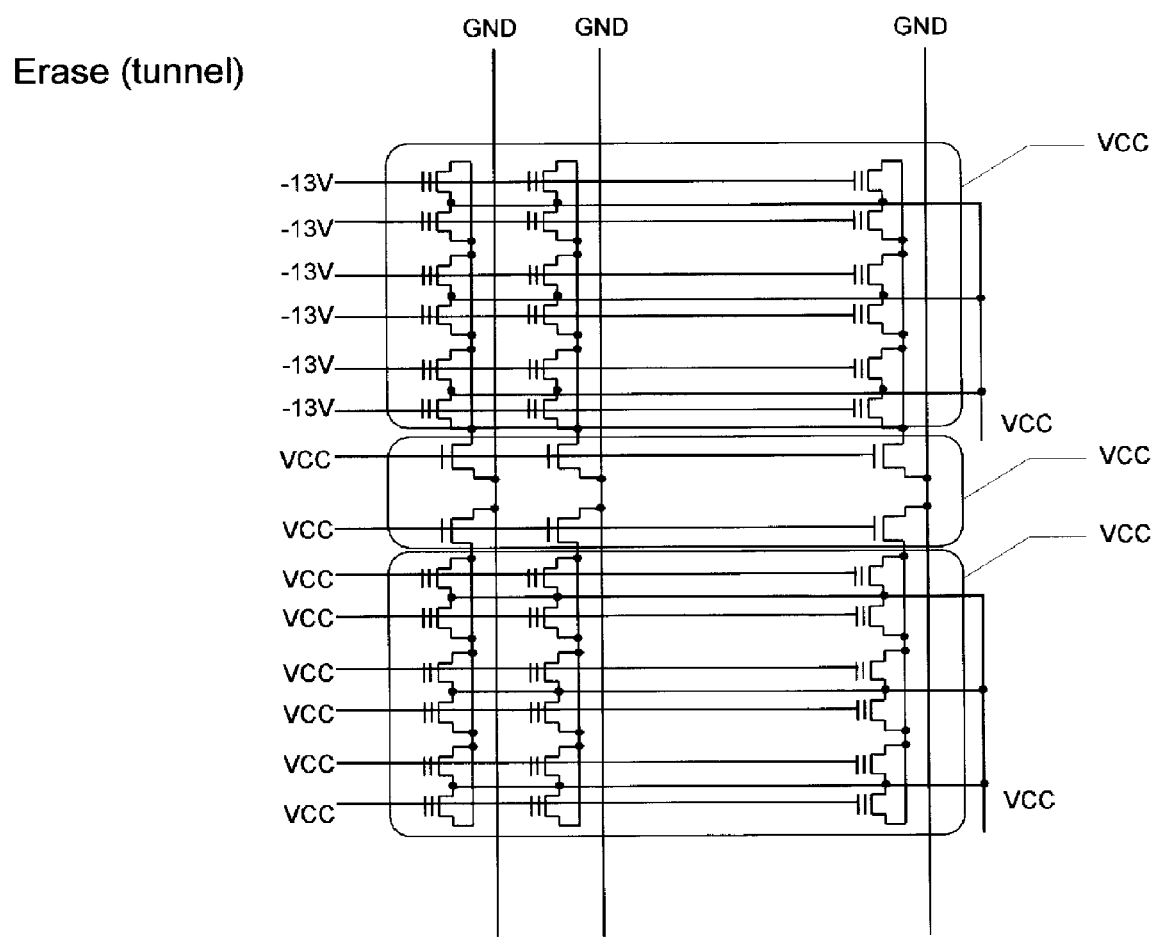
FIG. 11 shows a potential distribution in the equivalent circuit during erasing by FN tunneling.
Figure 12:
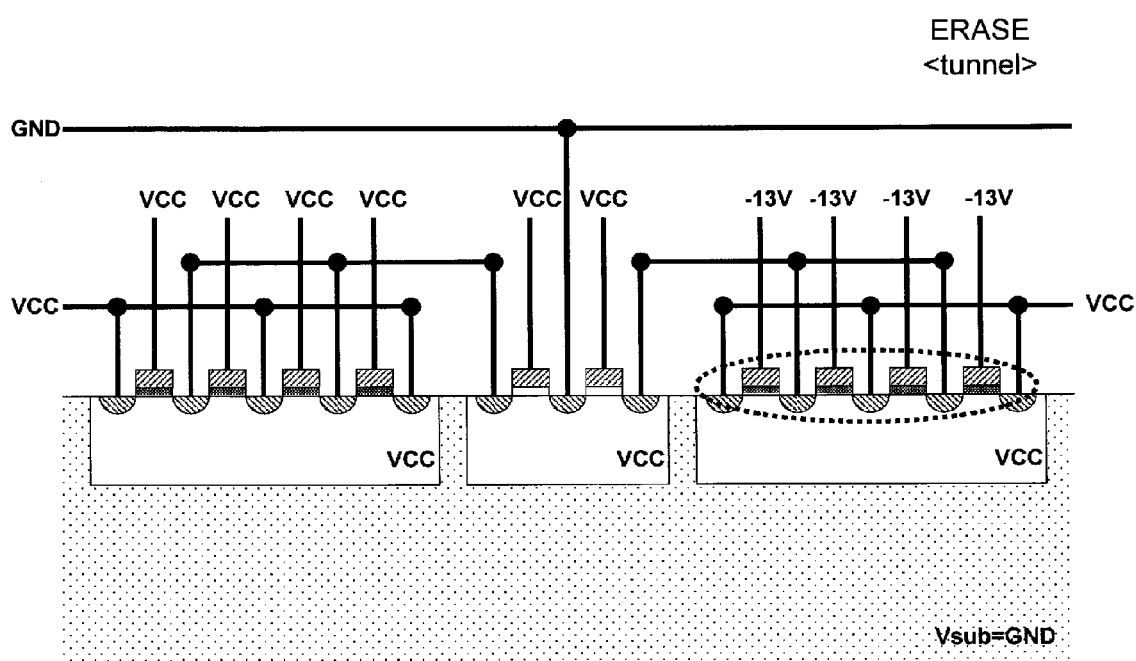
FIG. 12 shows a potential distribution in a cross sectional view during erasing by FN tunneling.

The discharging by FN tunnel is explained by referring to FIG. 3, FIG. 11 and FIG. 12. The erasing is performed for a cell well 12 unit. While the cell well 12 and the source line 23 are maintained at VCC, the word line 22 (gate 18) is applied with a high voltage of −13V, and the bit line 25 (drain 14) is floated. Therefore, a large potential difference occurs between the gate 18 and the cell well 12, rendering the trapped electrons in the charge trap layer 16 to be pulled out through the tunnel insulating layer toward the cell well 12 by FN tunneling effect.

Figure 13:
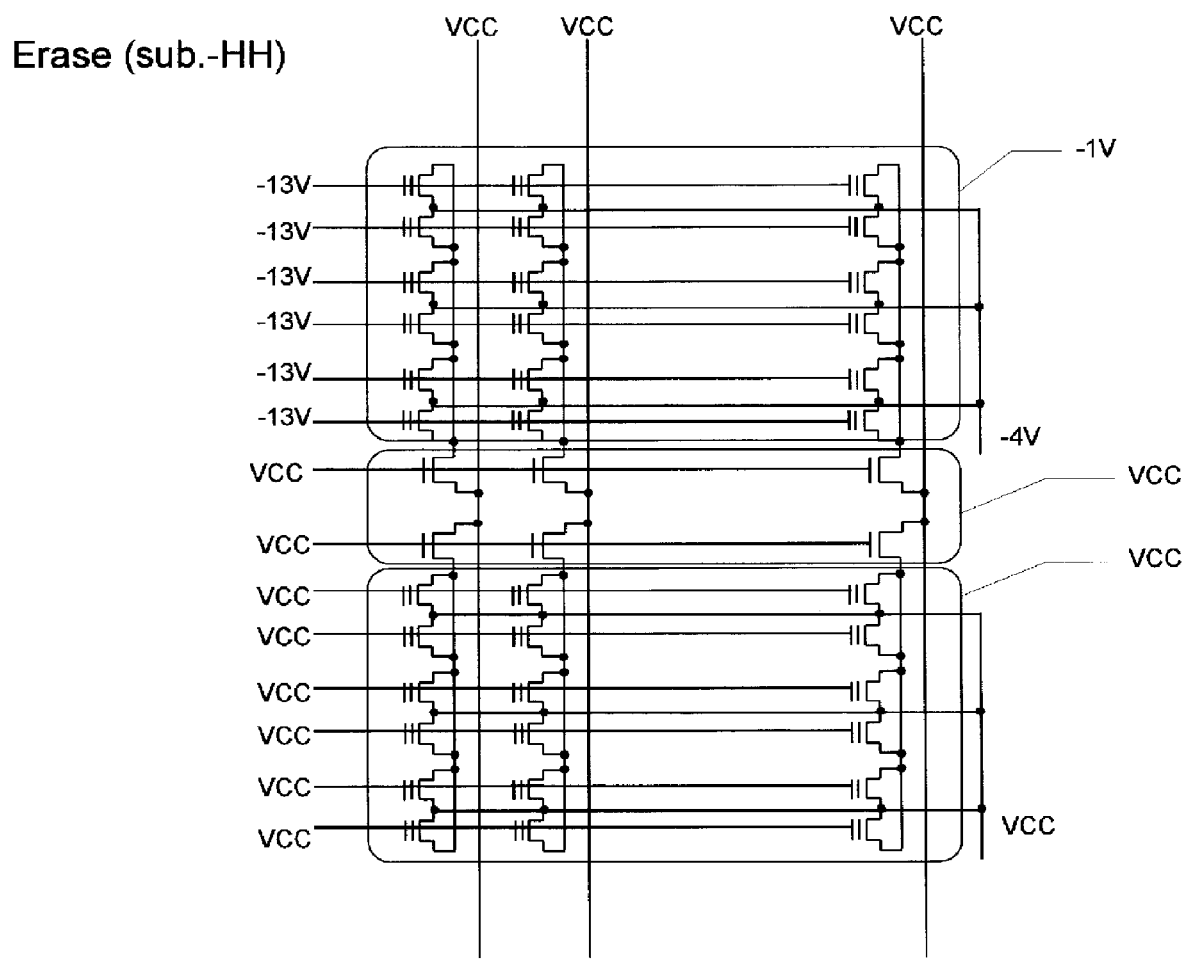
FIG. 13 shows a potential distribution in the equivalent circuit during erasing by substrate hot electron injection.
Figure 14:
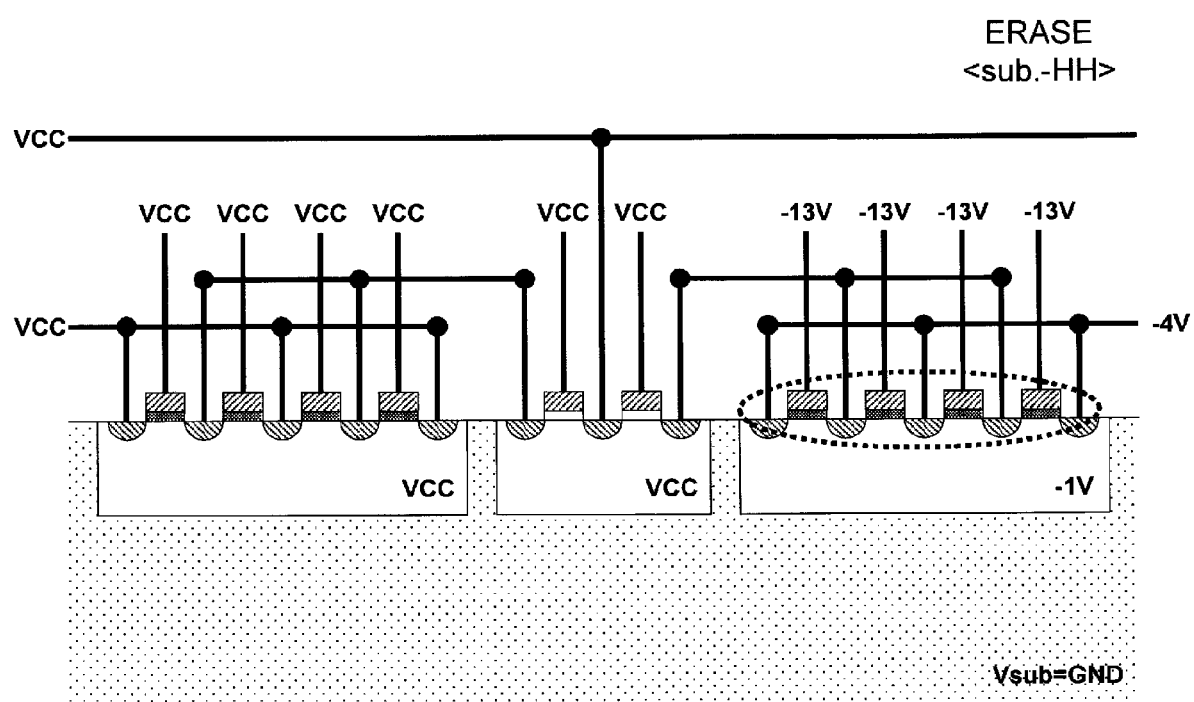
FIG. 14 shows a potential distribution in a cross sectional view during erasing by substrate hot electron injection.

Next, the method for erasing by using substrate hot hole injection is explained by referring to FIG. 3, FIG. 13 and FIG. 14. The cell well 12 is kept at −1V, the select gate is closed and the sub bit line 25 (drain 14) is opened. The word line 22 (gate 18) is applied with −13V and the source line 23 (source 13) is applied with −4V. Thus, by applying such voltages, the p type substrate 11, the n well 12 and the source 12 act as a pnp bipolar transistor, which makes the holes to be discharged to the source 13 from the p type semiconductor substrate 11. On the other hand, a part of the holes is pulled toward the gate electrode direction because the gate electrode 18 is applied with a negative high voltage. The holes move through the tunnel insulating layer 15 and penetrate into the charge trap layer 16. Negative charges of the electrons are canceled by positive charges of the holes, which erases the charges in the charge trap layer 16.

By the above potential distribution and operation the Y circuit can be configured by a fast circuit operating at GND-VCC.

As explained above, in this embodiment, the voltage between the drain and the source is reduced by applying an intermediate voltage the level of which is between the drain voltage and the source voltage to the source, the voltage across the source and the drain is reduced and equivalent Vth (absolute value) is increased by back gate effect which thereby renders a punch through to be suppressed, scaleability of gate length (scaled gate) to be improved greatly and gate length less than 0.1 μm may be realized with NOR type structure.

In this embodiment, the following two features are realized in order to achieve fast writing.

(1) By applying appropriate back gate voltage to the cell well 12, all operations are performed by applying 0V~VCC (1.8V) to the bit lines. Therefore, the Y circuit which plays a key role in fast writing can be configured only with high performance VCC transistors and no special circuit is necessary because no negative voltage is used.

(2) While a back gate voltage of approximately 4V is applied during reading, the verifying is also performed under this back gate voltage. Therefore, the switching from/to the programming to/from the verifying can be made quickly without using a large capacity power supply circuit.

Furthermore, a MONOS memory cell is better than a usual floating gate type flash memory (described in Japanese Patent Publication H09-8153, for example) in the following points.

The MONOS type is more robust against errors caused by defectives than a floating gate type. In the floating gate type, a defect which causes a very small leak in the tunnel insulating layer (a bottom oxide layer) may discharge all charges in the floating gate through this leak, rendering stored information to be lost. In a nonvolatile semiconductor memory device which requires decade long data retention, allowable leak level is considerably smaller than leak levels of other devices (for example, it requires $\times 10^{-8}$ small leak level compared with a DRAM). Therefore, realizing a process which does not cause any small defects becomes very difficult.

On the contrary, the MONOS type traps charges in a insulating layer of nitride layer. When there would be a small defect in upper or lower oxide layers, charges near to the defect may leak. However, not all charges flow out. Accordingly, the MONOS structure is more robust to defects than the floating gate type.

While the writing method to the memory cell of p channel MONOS structure is explained in this embodiment, the present invention can be applied to an n channel MONOS memory by inverting the polarity of the potential distribution and the like as shown in FIG. 3.

In this embodiment, the writing method to the memory cell with MONOS structure was shown in FIG. 1 and was explained; however the method may be applied to the floating gate type nonvolatile semiconductor memory, a nonvolatile semiconductor memory which holds the charges in a nano crystal layer, and the like.

The present invention may be applied not only to a NOR type memory cell array but also to a NAND type memory cell array.

The voltage values as shown in FIG. 7 and the like are examples and can be other values which meet the condition of the present invention. In these cases, an external supply voltage may be applied not only to the source and the drain but also to others.

Figure 15:
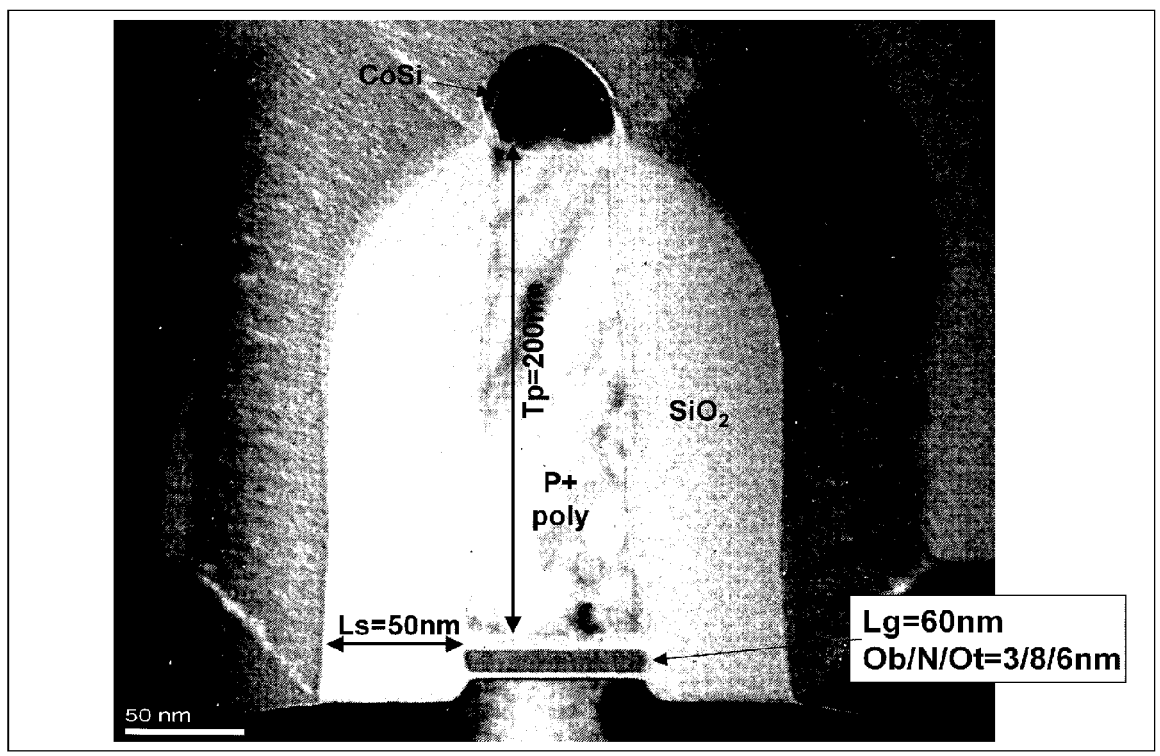
FIG. 15 shows a cross sectional transmission electron microscope photo of an experimental p-channel MONOS memory cell.
Figure 16:
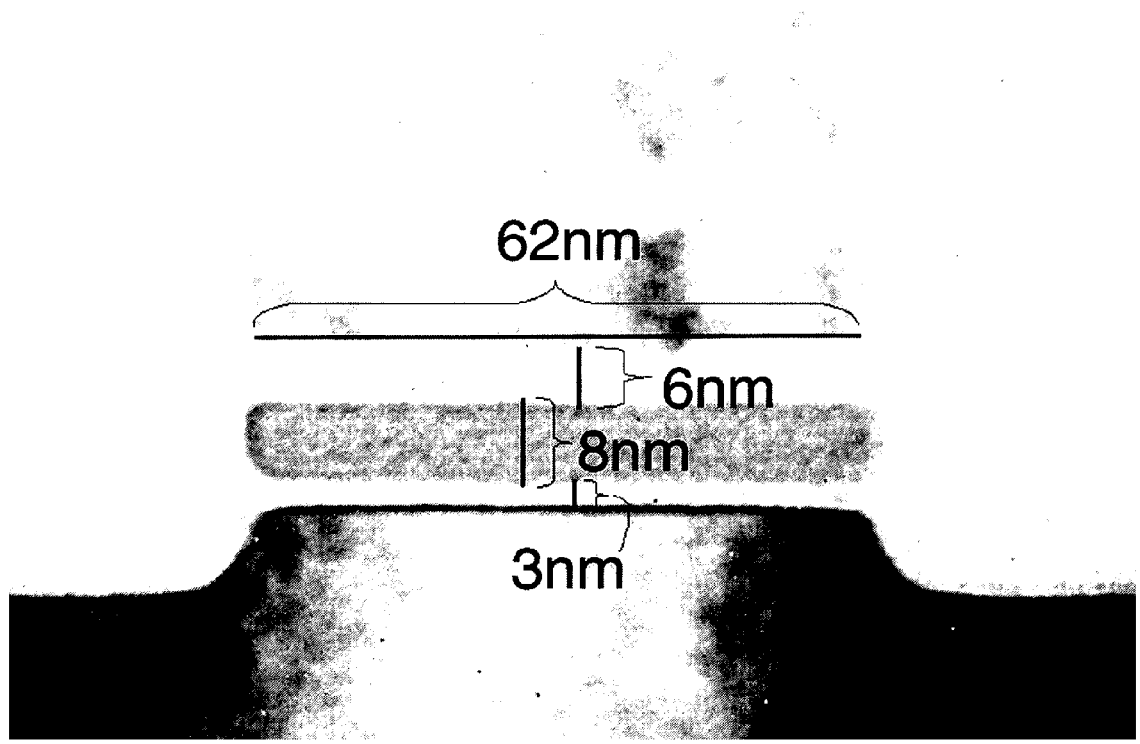
FIG. 16 shows an enlarged view of said transmission electron microscope photo.

The applicant made experimental p channel MONOS memory cells and evaluated their writing performances. FIG. 15 and FIG. 16 show a cross sectional transmission electron microscope (TEM) photo of the experimental memory cell. FIG. 16 shows an enlarged view near the ONO layer of the photo as shown in FIG. 15. In this memory cell, the thicknesses of the tunnel insulating layer, the charge trap layer and the insulating layer over the charge trap layer are 3 nm, 8 nm and 6 nm respectively, which approximately meet the scale explained in FIG. 1. The gate length is 62 nm. A poly-silicon gate electrode is made with a thickness of 200 nm in order to secure conductivity.

Figure 17:
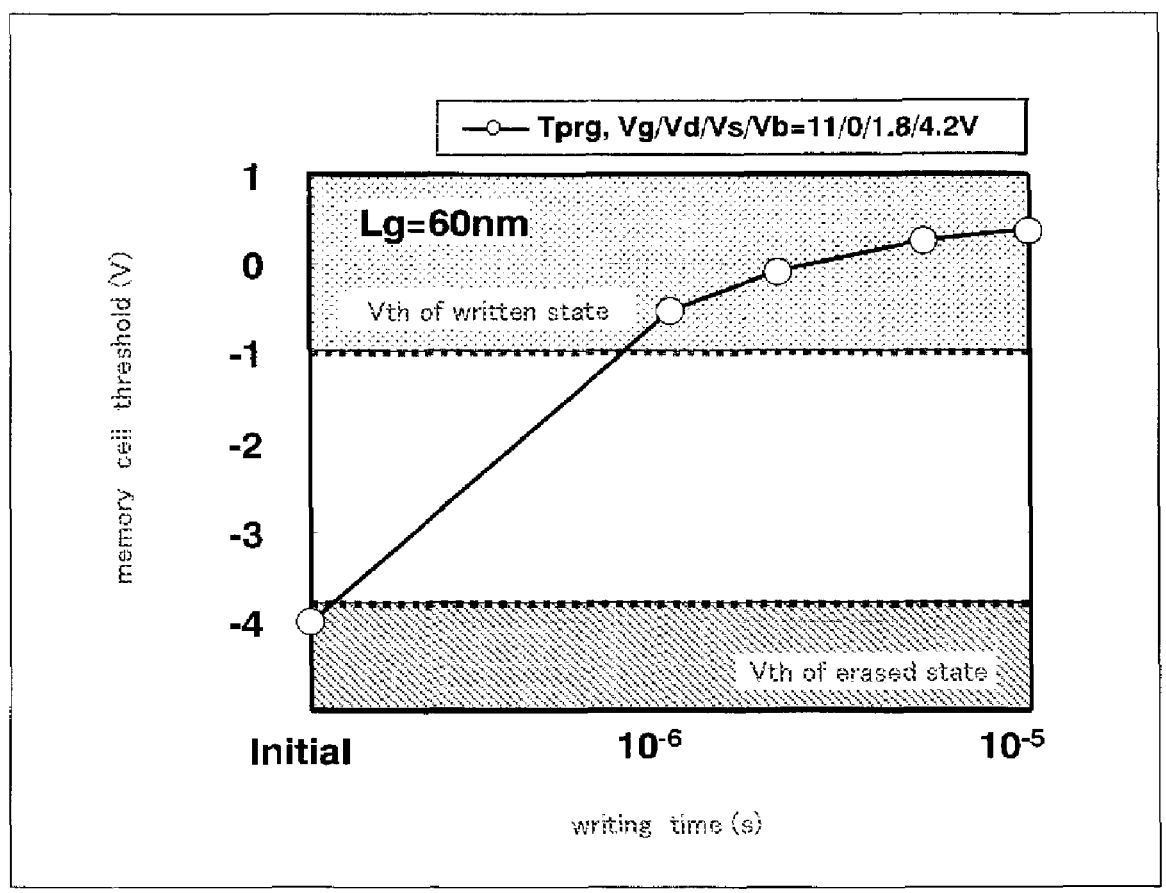
FIG. 17 shows a relationship between writing time and threshold voltage from experimental result on said p-channel MONOS memory cell.

In the memory cell having this structure, a writing test under the condition of the gate voltage Vg=11V, the cell well voltage (back gate voltage) Vsub=4.2V, the source voltage Vs=1.8V and the drain voltage Vd=0V exhibited the result shown in FIG. 17. According to this result, the writing finished in 1 μs, and shows that scaling of the gate length and higher writing speed are achieved at the same time.

The invention claimed is:

1. A method for programming bit data to a nonvolatile semiconductor memory device, said nonvolatile semiconductor memory device comprising,
   an n type well formed in a semiconductor substrate,
   a source and a drain of p+ regions formed in the surface of said n type well with a predetermined interval,
   a channel region formed between said source and said drain,
   a charge accumulation layer of a floating gate, a nanocrystal layer, a nonconductive charge trap layer formed above said channel region via a tunnel insulating layer, and
   a gate electrode formed above said charge accumulation layer via an insulating layer,
   said method comprising:
      applying Vg, Vsub, Vs and Vd to the gate electrode, the n type well, the source and the drain respectively during programming, the Vg, the Vsub, the Vs and the Vd being in a relationship of "Vg>Vsub>Vs>Vd" and "Vg−Vd" being not less than an electrical potential difference necessary to generate a band to band tunneling current at said channel region,
      thereby generating hot electrons near the drain by band to band tunneling; and
      injecting said hot electrons into said charge accumulation layer to program the bit data.

2. The method for programming to a nonvolatile semiconductor memory device according to claim 1, wherein two of the voltages from said Vg, Vsub, Vs and Vd are supplied from an external power supply.

3. The method for programming to a nonvolatile semiconductor memory device according to claim 1, wherein at least the Vd among said Vg, Vsub, Vs and Vd is supplied from an external power supply.

4. The method for programming to a nonvolatile semiconductor memory device according to claim 1, wherein the Vs and the Vd among said Vg, Vsub, Vs and Vd are supplied from an external power supply.

5. The method for programming to a nonvolatile semiconductor memory device according to claim 4, wherein said Vs is a power supply voltage and the Vd is a ground voltage.

6. A method for programming bit data to a nonvolatile semiconductor memory device, said nonvolatile semiconductor memory device comprising,
   a p type well formed in a semiconductor substrate,
   a source and a drain of n+ regions formed in the surface of said p type well with a predetermined interval,
   a channel region formed between said source and said drain,
   a charge accumulation layer of a floating gate, a nanocrystal layer, a nonconductive charge trap layer formed above said channel region via tunnel insulating layer, and
   a gate electrode formed above said charge accumulation layer via an insulating layer,
   said method comprising:
   applying Vg, Vsub, Vs, and Vd to the gate electrode, the p type well, the source and the drain respectively during programming, the Vg, the Vsub, the Vs, and the Vd being in a relationship of "Vg<Vsub<Vs<Vd" and "Vd−Vg" being not less than an electrical potential difference necessary to generate a band to band tunneling current at said channel region;
   thereby generating hot holes near the drain by band to band tunneling; and
   injecting said hot holes into said charge accumulation layer to program the bit data.

7. The method for programming to a nonvolatile semiconductor memory device according to claim 6, wherein two of the voltages from said Vg, Vsub, Vs and Vd are supplied from an external power supply.

8. The method for programming to a nonvolatile semiconductor memory device according to claim 6, wherein at least the Vd among said Vg, Vsub, Vs and Vd is supplied from an external power supply.

9. The method for programming to a nonvolatile semiconductor memory device according to claim 6, wherein the Vs and the Vd among said Vg, Vsub, Vs and Vd are supplied from an external power supply.

10. The method for programming to a nonvolatile semiconductor memory device according to claim 9, wherein said Vs is a power supply voltage and the Vd is a ground voltage.

11. A nonvolatile semiconductor memory device, comprising:
   an n type well formed in a semiconductor substrate;
   a source and a drain of p+ regions formed in the surface of said n type well with a predetermined interval;
   a channel region formed between said source and said drain;
   a charge accumulation layer of a floating gate, a nanocrystal layer, a nonconductive charge trap layer formed above said channel region via a tunnel insulating layer; and
   a gate electrode formed above said charge accumulation layer via an insulating layer,
   wherein memory cells of said memory device are programmed by:
      applying Vg, Vsub, Vs and Vd to the gate electrode, the n type well, the source and the drain respectively during programming, the Vg, the Vsub, the Vs and the Vd being in a relationship of "Vg>Vsub>Vs>Vd" and "Vg−Vd" being not less than an electrical potential difference necessary to generate a band to band tunneling current at said channel region,
      thereby generating hot electrons near the drain by band to band tunneling; and
      injecting said hot electrons into said charge accumulation layer to program the bit data, and
      wherein the memory cells are arrayed by connecting in a NOR type or in a NAND type circuit.

12. A nonvolatile semiconductor memory device comprising:
   a p type well formed in a semiconductor substrate;
   a source and a drain of n+ regions formed in the surface of said p type well with a predetermined interval;
   a channel region formed between said source and said drain;
   a charge accumulation layer of a floating gate, a nanocrystal layer, a nonconductive charge trap layer formed above said channel region via tunnel insulating layer, and;
   a gate electrode formed above said charge accumulation layer via an insulating layer,
   wherein memory cells of said memory device are programmed by
   applying Vg, Vsub, Vs, and Vd to the gate electrode, the p type well, the source and the drain respectively during programming, the Vg, the Vsub, the Vs, and the Vd being in a relationship of "Vg<Vsub<Vs<Vd" and "Vd−Vg" being not less than an electrical potential difference necessary to generate a band to band tunneling current at said channel region, thereby generating hot holes near the drain by band to band tunneling, and injecting said hot holes into said charge accumulation layer to program the bit data, and wherein the memory cells are arrayed by connecting in a NOR type or in a NAND type circuit.

* * * * *